United States Patent
Tanner

(10) Patent No.: US 12,207,383 B2
(45) Date of Patent: Jan. 21, 2025

(54) MICROWAVE DRIVEN PLASMA ION SOURCE

(71) Applicant: TOFWERK AG, Thun (CH)

(72) Inventor: Martin Tanner, Bern (CH)

(73) Assignee: TOFWERK AG, Thun (CH)

( * ) Notice: Subject to any disclaimer, the term of this patent is extended or adjusted under 35 U.S.C. 154(b) by 211 days.

(21) Appl. No.: 17/916,205

(22) PCT Filed: Apr. 1, 2021

(86) PCT No.: PCT/EP2021/058695
§ 371 (c)(1),
(2) Date: Sep. 30, 2022

(87) PCT Pub. No.: WO2021/198462
PCT Pub. Date: Oct. 7, 2021

(65) Prior Publication Data
US 2023/0164903 A1 May 25, 2023

(30) Foreign Application Priority Data
Apr. 2, 2020 (EP) .................................. 20167841

(51) Int. Cl.
*H05H 1/30* (2006.01)
*H01J 37/16* (2006.01)
(Continued)

(52) U.S. Cl.
CPC ............ *H05H 1/30* (2013.01); *H01J 37/165* (2013.01); *H01J 37/3488* (2013.01); *H01J 49/0468* (2013.01)

(58) Field of Classification Search
CPC ...... H01J 37/16; H01J 37/165; H01J 37/3488; H01J 49/0468; H01J 49/10; H01J 49/105;
(Continued)

(56) References Cited

U.S. PATENT DOCUMENTS 4,924,061 A * 5/1990 Labat ...................... H05H 1/46
219/121.48
5,086,255 A * 2/1992 Okamoto .............. H01J 49/105
315/111.21
(Continued)

FOREIGN PATENT DOCUMENTS

CN  103269557 A  8/2013
GB  2264808 A  9/1993
(Continued)

OTHER PUBLICATIONS

International Search Report, issued in PCT/EP2021/058695, PCT/ISA/210, dated Jun. 4, 2021.
(Continued)

*Primary Examiner* — Thai Pham
(74) *Attorney, Agent, or Firm* — BIRCH, STEWART, KOLASCH & BIRCH, LLP

(57) ABSTRACT

The invention relates to a microwave driven plasma ion source (1) for ionising a sample to be ionised to sample ions, the microwave driven plasma ion source (1) including a sample intake (6) for inserting the sample from an outside of the microwave driven plasma ion source (1) into an inside (3) of the microwave driven plasma ion source (1): a microwave generator (10) for generating microwaves for generating a plasma (101) from a plasma gas (100): a plasma torch (20) providing a plasma torch orientation direction (29) having an inside (21) for housing (2) a process of generation of the plasma (101) from the plasma gas (100) and for housing a process of ionising the sample to the sample ions by exposing the sample to the plasma (101), wherein the plasma torch (20) comprises a torch outlet (22) for letting out the plasma (101) and the sample ions from the inside (21) of the plasma torch (20) essentially in the plasma torch orientation direction (29) to an outside of the plasma (Continued)

torch (20), the torch outlet (22) having a torch aperture. Furthermore the microwave driven plasma ion source (1, 201) includes a shielding (4) for shielding off the microwaves from passing from the inside (3) of the microwave driven plasma ion source (1) to the outside of the microwave driven plasma ion source (1), wherein the shielding (4) comprises a shielding outlet (5) for letting out the plasma (101) and the sample ions from the inside (3) of the microwave driven plasma ion source (1) essentially in the plasma torch orientation direction (29) to the outside of the microwave driven plasma ion source (1), the shielding outlet (5) having a shielding aperture. Thereby, the shielding outlet (5) is fluidly coupled to the torch outlet (22) for letting out the plasma (101) and the sample ions from the inside (21) of the plasma torch (20) essentially in the plasma torch orientation direction (29) to the outside of the microwave driven plasma ion source (1), wherein a size of the shielding aperture is less than 150%, preferably less than 125%, particular preferably less than 110% of a size of the torch aperture, wherein both the size of the shielding aperture and the size of the torch aperture are measured in units of area.

20 Claims, 4 Drawing Sheets

(51) Int. Cl.
*H01J 37/34* (2006.01)
*H01J 49/04* (2006.01)
*H01J 49/10* (2006.01)
*H05H 1/46* (2006.01)

(58) Field of Classification Search
CPC ......... H01J 49/26; H05H 1/00; H05H 1/0062; H05H 1/26; H05H 1/30; H05H 1/46; H05H 1/461
See application file for complete search history.

(56) References Cited

U.S. PATENT DOCUMENTS

| | | | | |
|---|---|---|---|---|
| 5,252,827 | A * | 10/1993 | Koga | H01J 49/105 250/252.1 |
| 5,308,977 | A * | 5/1994 | Oishi | H01J 49/105 250/281 |
| 6,362,449 | B1 * | 3/2002 | Hadidi | H05H 1/30 219/121.36 |
| 2016/0029472 | A1 * | 1/2016 | Jevtic | H01J 37/32467 315/39 |
| 2022/0181135 | A1 * | 6/2022 | Hattendorf | H01J 49/04 |

FOREIGN PATENT DOCUMENTS

| | | |
|---|---|---|
| JP | 5-50649 U | 7/1993 |
| JP | 8-250291 A | 9/1996 |
| WO | WO 2004/068559 A2 | 8/2004 |

OTHER PUBLICATIONS

Oishi et al., "Elemental mass spectrometry using a nitrogen microwave-induced plasma as an ion source", Spectrochimica Acta, Aug. 1, 1994, vol. 49B, No. 9, p. 901-914.

Written Opinion of the International Searching Authority, issued in PCT/EP2021/058695, PCT/ISA/237, dated Jun. 4, 2021.

* cited by examiner

MICROWAVE DRIVEN PLASMA ION SOURCE

TECHNICAL FIELD

The invention relates to a microwave driven plasma ion source for ionising a sample to be ionised to sample ions. This microwave driven plasma ion source includes a sample intake for inserting the sample from an outside of the microwave driven plasma ion source into an inside of the microwave driven plasma ion source, a microwave generator for generating microwaves for generating a plasma from a plasma gas, and a plasma torch providing a plasma torch orientation direction and having an inside for housing a process of generation of the plasma from the plasma gas and for housing a process of ionising the sample to the sample ions by exposing the sample to the plasma, wherein the plasma torch comprises a torch outlet for letting out the plasma and the sample ions from the inside of the plasma torch essentially in the plasma torch orientation direction to an outside of the plasma torch, the torch outlet having a torch aperture.

BACKGROUND ART

Microwave driven plasma ion sources for ionising a sample to be ionised to sample ions pertaining to the technical field initially mentioned are known. US 2016/0025656 A1 of Radom Corporation for example describes such a microwave driven plasma ion source including a microwave generator and a plasma torch. This microwave driven plasma ion source further includes a microwave resonator which is supported within a cylindrical radio-frequency shielding. The microwave resonator has the shape of a circular annulus and provides a clearance. The plasma torch is partially arranged in this clearance. In operation, microwaves are generated with the microwave generator and directed through a waveguide to the microwave resonator in the shielding. Furthermore, plasma gas is inserted into the inside of the plasma torch for generating a plasma by inductively coupling the plasma gas, to an electromagnetic field generated by the microwave resonator being exposed to the microwaves generated by the microwave generator. At the same time, the sample is introduced into the inside of the plasma torch and exposed to the plasma for being ionised to the sample ions.

The operation parameters of such known microwave driven plasma ion sources can be optimised for maximising the ionisation of the sample in order to obtain a maximum number of sample ions for a given sample. However, the optimal operation parameters can change depending on the use of the microwave driven plasma ion source. In particular, in case an instrumentation which uses the sample ions generated by such a microwave driven plasma ion source is changed, the optimal operation parameters of the respective microwave driven plasma ion source are likely to be changed, too. Thus, such microwave driven plasma ion sources have the disadvantage that their optimisation for a maximised sample ion generation is difficult and complex. This is in particular the case whenever the respective microwave driven plasma ion source is used for generating sample ions that are then used by some other instrumentation. Examples of such other instrumentations are ion mobility analysers and mass analysers. For the same reason, such microwave driven plasma ion sources are difficult to be optimised for maximised sample ion generation whenever they are used as part of an ion mobility spectrometer and/or a mass spectrometer.

In the present text, the formulation "and/or" is occasionally used for linking two features. This formulation is to be understood as either one of the two features or both of the features. Thus, "A and/or B" is to be understood as three equivalent options, wherein one option is A, another option is B and yet another option is both A and B.

SUMMARY OF THE INVENTION

It is the object of the invention to create a microwave driven plasma ion source pertaining to the technical field initially mentioned, that enables a simple and stable optimisation of its operation parameters for maximised sample ion generation.

The solution of the invention is specified by the features of claim 1. According to the invention, the microwave driven plasma ion source includes a shielding for shielding off the microwaves from passing from the inside of the microwave driven plasma ion source to the outside of the microwave driven plasma ion source, wherein the shielding comprises a shielding outlet for letting out the plasma and the sample ions from the inside of the microwave driven plasma ion source essentially in the plasma torch orientation direction to the outside of the microwave driven plasma ion source, the shielding outlet having a shielding aperture, wherein the shielding outlet is fluidly coupled to the torch outlet for letting out the plasma and the sample ions from the inside of the plasma torch essentially in the plasma torch orientation direction to the outside of the microwave driven plasma ion source, wherein a size of the shielding aperture is less than 150%, preferably less than 125%, particular preferably less than 110% of a size of the torch aperture, wherein both the size of the shielding aperture and the size of the torch aperture are measured in units of area.

According to the invention, the microwave driven plasma ion source includes a sample intake for inserting the sample from an outside of the microwave driven plasma ion source into an inside of the microwave driven plasma ion source. In one example, this sample intake is an intake for inserting a sample from an environment surrounding the microwave driven plasma ion source into the inside of the microwave driven plasma ion source. In another example, the sample intake is a connector for being connected to a sample source for inserting the sample from the sample source via the sample intake into the microwave driven plasma ion source for ionising the sample.

Advantageously, the sample is a gas, an aerosol comprising aerosol particles dispersed in a gas or, more broadly, discrete particles entrained in a gas. In case of an aerosol comprising aerosol particles dispersed in a gas, the aerosol particles may be solid or liquid particles. Aerosol particles usually have a size in a range from 10 nm to 10 μm. Aerosol particles smaller than 10 nm have a large surface to size ratio and therefore grow quickly into larger aerosol particles. Aerosol particles larger than 10 μm on the other hand become too heavy to be suspended for a long time and will eventually fall to the ground. For this reason, the typical size range of aerosol particles in a sample being an aerosol is from 50 nm to 2'000 nm or 2 μm, respectively. As compared to the aerosol, the sample being discrete particles entrained in a gas is to be understood broader. Such discrete particles entrained in a gas can be generated right in front of the sample intake of the microwave driven plasma ion source for example by laser ablation of some sample material. In this case, the discrete particles can have sizes that exceed the upper limit of 10 μm of aerosol particles and as well as sizes that fall below the lower limit of 10 nm of aerosol particles. Of course, the discrete particles can have sizes like aerosol particles, too.

According to the solution of the invention, the microwave driven plasma ion source includes a microwave generator for generating microwaves for generating a plasma from a plasma gas. Thereby, the microwaves are the electromagnetic waves of radio frequency electromagnetic radiation in the microwave range. This microwave range is advantageously the range of electromagnetic radiation having a frequency in the range from 1 MHz to 10 GHz, particular advantageously from to 30 MHz to 3 GHZ, most advantageously from 30 MHz to 300 MHz or from 300 MHz to 3 GHz.

The microwaves generated by the microwave generator can be used directly and/or indirectly to generate the plasma from the plasma gas. Thus, in a first example, the plasma gas is exposed to the microwaves generated by the microwave generator for generating the plasma from the plasma gas. In a second example, the microwave driven plasma ion source comprises a microwave resonator, wherein the microwave resonator is exposed to the microwaves generated by the microwave generator such that the microwave resonator generates an electromagnetic field due to a resonant behaviour of the microwave resonator when being exposed to the microwaves, wherein the plasma gas is inductively coupled to the electromagnetic field generated by the microwave resonator for generating the plasma from the plasma gas. In a third example, the first and second examples are combined in that the plasma gas is exposed to microwaves generated by the microwave generator and inductively coupled to the electromagnetic field generated by the microwave resonator for generating the plasma from the plasma gas.

In all three examples, the generation of the plasma from the plasma gas is directly or indirectly and thus ultimately driven by the microwaves generated by the microwave generator. Therefore, in all three examples, the microwave generator is a microwave generator for generating microwaves for generating the plasma from the plasma gas.

According to the invention, the microwave driven plasma ion source includes a plasma torch providing a plasma torch orientation direction and having an inside for housing a process of generation of the plasma from the plasma gas and for housing a process of ionising the sample to the sample ions by exposing the sample to the plasma. Thereby, the process of generation of the plasma from the plasma gas is run in a first region in the inside of the plasma torch, while the process of ionising the sample to the sample ions by exposing the sample to the plasma is run in a second region in the inside of the plasma torch. Thereby, the first region and the second region can be completely separated regions, partially overlapping regions or fully overlapping regions. In the case where the first region and the second region are fully overlapping regions, in one example, one of the first and second regions is bigger than the other one of the first and second regions and fully covers this other one of the first and second regions. In another example where the first region and the second region are fully overlapping regions, both regions are identical. Independent of how the first region and the second region is shaped and whether they are separate, partially overlapping or fully overlapping, the first region and the second region have in common that they are both located in the inside of the plasma torch and are thus housed in the inside of the plasma torch. Thus, both, the process of generation of the plasma from the plasma gas and the process of ionising the sample to sample ions by exposing the sample to the plasma are housed in the inside of the plasma torch.

According to the invention, the microwave driven plasma ion source includes a shielding for shielding off the microwaves from passing from the inside of the microwave driven plasma ion source to the outside of the microwave driven plasma ion source. Thereby, "shielding off" preferably means that less than 5%, particular preferably less than 1%, of a total intensity being a power (energy per time unit) of the electromagnetic radiation being the microwaves generated in the inside of the microwave driven plasma ion source reaches the outside of the microwave driven plasma ion source. Thereby, the intensity of the electromagnetic radiation being the microwaves reaching the outside of the microwave driven plasma ion source is preferably the locally measured intensity integrated over all positions on a surface of a sphere surrounding the microwave driven plasma ion source.

According to the invention, the plasma torch comprises a torch outlet for letting out the plasma and the sample ions from the inside of the plasma torch essentially in the plasma torch orientation direction to an outside of the plasma torch, the torch outlet having a torch aperture. Furthermore, according to the invention, the shielding comprises a shielding outlet for letting out the plasma and the sample ions from the inside of the microwave driven plasma ion source essentially in the plasma torch orientation direction to the outside of the microwave driven plasma ion source, the shielding outlet having a shielding aperture. This shielding outlet is fluidly coupled to the torch outlet for letting out the plasma and the sample ions from the inside of the plasma torch essentially in the plasma torch orientation direction to the outside of the microwave driven plasma ion source. Thereby, the plasma torch can be arranged partially inside the microwave driven plasma ion source or fully inside the microwave driven plasma ion source.

In one example, the plasma torch comprises a tube surrounding the inside of the plasma torch, wherein one end of the tube is open and forms the torch outlet. In this example, the plasma torch orientation direction is parallel to a length axis of the tube and points from the inside of the tube out of the tube, thereby pointing through the open end of the tube which forms the torch outlet. Thus, the plasma and the sample ions which move with some divergence along the tube move essentially in the plasma torch orientation direction when being let out of the plasma torch through the torch outlet.

In this example, in case the tube protrudes through the shielding outlet from the inside of the microwave driven plasma ion source, wherein the torch outlet is outside of the inside of the microwave driven plasma ion source, the plasma torch is arranged partially inside the microwave driven plasma ion source. In case the tube however ends with the torch outlet within the inside of the microwave driven plasma ion source and the rest of the plasma torch is arranged inside the microwave driven plasma ion source, too, the plasma torch is arranged fully inside the microwave driven plasma ion source. In both cases, the shielding outlet is fluidly coupled to the outlet for letting out the plasma and the sample ions from the inside of the plasma torch essentially in the plasma torch orientation direction to the outside of the microwave driven plasma ion source.

Independent of this example, the shielding outlet is advantageously arranged in the vicinity of the torch outlet for ensuring direct passage of the plasma and the sample ions from the inside of the plasma torch essentially in the plasma torch orientation direction to the outside of the microwave driven plasma ion source. Preferably, the shielding outlet is arranged at a distance of less than 5 mm, particular preferably less than 2.5 mm from the torch outlet. In a variant, the shielding outlet is arranged flush with the torch outlet.

According to the invention, the size of the shielding aperture is less than 150%, preferably less than 125%, particular preferably less than 110% of the size of the torch aperture, wherein both the size of the shielding aperture and the size of the torch aperture are measured in units of area. This means that the shielding aperture has a limited size. Due to this limited size, the microwaves are better shielded off from passing from the inside of the microwave driven plasma ion source to the outside of the microwave driven plasma ion source in an area of the shielding outlet. Consequently, less intensity of the electromagnetic radiation being the microwaves generated in the inside of the microwave driven plasma ion source reaches the outside of the microwave driven plasma ion source in the area of the shielding outlet. Thus, in case a conducting element is arranged in a vicinity of the shielding outlet, this conducting element is exposed to less microwaves resulting in less microwaves being generated by the conducting element due to induction.

At the same time, the limited size of the shielding outlet has the effect that in the area of the shielding outlet, the microwaves generated by the conducting element due to induction are better shielded off from passing from the outside of the microwave driven plasma ion source to the inside of the microwave driven plasma ion source. As consequence, a field of microwaves in the inside of the microwave driven plasma ion source is changed less by feedback effects when a conducting element is moved in the vicinity of the shielding outlet. Thus, the field of microwaves in the inside of the microwave driven plasma ion source is more stable and less disturbed by movements of conducting elements in the vicinity of the shielding outlet. Therefore, the operation parameters of the microwave driven plasma ion source can be optimised for maximised sample ion generation and change less when another instrumentation like an ion mobility analyser and/or a mass analyser is moved relative to the microwave driven plasma ion source or when a setup of such another instrumentation is changed. Consequently, the optimisation of the operation parameters of the microwave driven plasma ion source for maximised sample ion generation is simplified and more stable. This advantage is increased with decreased size of the shielding aperture. Therefore, the advantage is increased if the size of the shielding aperture is less than 125% of the size of the torch aperture as compared to when the size of the shielding aperture is less than 150% of the size of the torch aperture. Furthermore, the advantage is increased if the size of the shielding aperture is less than 110% of the size of the torch aperture as compared to when the size of the shielding aperture is less than 125% of the size of the torch aperture.

Independent of whether the size of the shielding aperture is less than 150%, less than 125% or less than 110% of the size of the torch aperture, the size of the shielding aperture is advantageously at least 100% of the size of the torch aperture, wherein both the size of the shielding aperture and the size of the torch aperture are measured in units of area. This has the advantage that the shielding aperture is large enough to enable to let the plasma and a maximum number the sample ions out from the inside of the plasma torch to the outside of the microwave driven plasma ion source.

Alternatively, the size of the shielding aperture is less than 100% of the size of the torch aperture.

Preferably, the plasma torch comprises a plasma gas inlet for inserting the plasma gas from a plasma gas source through the plasma gas inlet into the inside of the plasma torch. Thereby, the plasma gas source may be part of the microwave driven plasma ion source or may be separate from the microwave driven plasma ion source. In the latter case, the microwave driven plasma ion source advantageously comprises a plasma gas source connector fluidly coupled to the plasma gas inlet, the plasma gas source connector being fluidly connectable to the separate plasma gas source for supplying plasma gas from the separate plasma gas source via the plasma gas source connector and the plasma gas inlet into the inside of the plasma torch.

Advantageously, the microwave driven plasma ion source includes a plasma gas source fluidly coupleable to the plasma gas inlet.

Alternatively, the plasma torch may go without such a plasma gas inlet.

Preferably, the plasma torch comprises a sample inlet fluidly coupled to the sample intake for inserting the sample from the sample intake into the inside of the plasma torch. In a variant thereof, the sample inlet and the sample intake may be combined and thus be the same. In this variant, the sample inlet of the plasma torch is at the same time the sample intake of the microwave driven plasma ion source.

Alternatively, the plasma torch may go without such a sample inlet.

Advantageously, the plasma torch is arranged in the inside, particular advantageously fully in the inside of the microwave driven plasma ion source. This has the advantage that the plasma torch is optimally shielded off from external influences, thus being more stably operatable with given operation parameters. Consequently, an optimisation of the operation parameters for operating the microwave driven plasma ion source for maximised sample ion generation is more stably maintained.

Alternatively, the plasma torch is not arranged in the inside of the microwave driven plasma ion source.

Preferably, a size of the torch aperture measured in units of area is in a range from 70 $mm^2$ to 900 $mm^2$, particular preferably in a range from 110 $mm^2$ to 600 $mm^2$. This has the advantage that the sample ion generation with the microwave driven plasma ion source can be optimised by balancing the maximisation of the absolute number of sample ions generated by the microwave driven plasma ion source per time unit versus the maximisation of a density of the sample ions generated by the microwave driven plasma ion source in a region of the torch aperture and the shielding aperture, wherein the term density refers to the number of sample ions per spatial unit.

Alternatively, the size of the torch aperture is maximally 70 $mm^2$ or minimally 900 $mm^2$.

Preferably, the inside of the microwave driven plasma ion source has an outer limit being a closed surface, wherein the shielding defines the closed surface and covers at least 98%, particular preferably at least 99%, most preferably at least 99.5% of the closed surface. Advantageously, at any opening in the shielding, the outer limit of the inside of the microwave driven plasma ion source is the surface connecting the edges of the respective opening to a closed surface having the smallest possible surface area. Advantageously, openings in the shielding which have a maximum diameter being smaller than 20% of a wavelength of the shortest microwaves generatable by the microwave generator, particular advantageously which have a maximum diameter being smaller than 6 mm, are considered as being fully covered by the shielding. Thereby, the maximum diameter is advantageously the longest possible straight line measured across the respective opening from any position on an edge of the respective opening to any other position on the edge of the respective opening. Larger openings in the shielding however are not considered as being covered by the shielding.

Alternatively, however, the shielding covers less than 98% of the closed surface being the outer limit of the inside of the microwave driven plasma ion source.

Preferably, the shielding is made from metal. In this case, the shielding is a metal shielding. Thereby, it is irrelevant whether the shielding is a metal coating on some shielding support structure or whether the shielding is made from metal plates, mesh or grid, thereby being supported by some shielding support structure or being selfstable due to an integrated support structure or due to forming the support structure by itself. Independent of how the metal shielding is formed, it has the advantage that an efficient shielding for shielding off the microwaves from passing from the inside of the microwave driven plasma ion source to the outside of the microwave driven plasma ion source can be provided.

Particular preferably, in a region of the shielding outlet, the shielding is made from tungsten. Since tungsten is the element with the highest melting point, this has the advantage that the shielding withstands the high temperatures when being hit by parts of the plasma and the sample ions passing from the inside of the plasma torch to the outside of the microwave driven plasma ion source. In variant, in the region of the shielding outlet, the shielding is made from another metal than tungsten.

In a preferred variant, the entire shielding is made from tungsten. In another preferred variant however, a main part of the shielding is made from another metal than tungsten, while in the region of the shielding outlet, the shielding is made from tungsten. This latter variant has the advantage that the shielding can be constructed less costly.

Alternatively, the shielding is made from another material than a metal.

Preferably, the microwave driven plasma ion source comprises a cooling liquid circuit for containing a cooling liquid for cooling the shielding, wherein the shielding, in particular in an area of the shielding outlet, is coolable by the cooling liquid. Advantageously, the cooling liquid is part of the microwave driven plasma ion source and contained in the cooling liquid circuit. The microwave driven plasma ion source may however go without the cooling liquid and without the cooling liquid being contained in the cooling liquid circuit. This latter variant may for example be advantageous for transporting the microwave driven plasma ion source.

Particular preferably, the cooling liquid circuit is a closed loop circuit.

Advantageously, the cooling liquid is water or liquid nitrogen. Nonetheless, the cooling liquid may be some other liquid.

Alternatively, the microwave driven plasma ion source may go without such a cooling liquid circuit for containing a cooling liquid for cooling the shielding.

Advantageously, the microwave driven plasma ion source includes a microwave resonator for generating an electromagnetic field for inductively coupling the plasma gas to the electromagnetic field for generation of the plasma from the plasma gas, wherein the microwave resonator exhibits a resonant behaviour and generates the electromagnetic field when being exposed to the microwaves generated by the microwave generator. In this case, the plasma is generated by inductively coupling the plasma gas to the electromagnetic field generated by the microwave resonator. In one variant, the microwaves generated by the microwave generator are involved only indirectly because they are used to drive the microwaves resonator. In another variant, however, the plasma gas is exposed to microwaves generated by the microwave generator and inductively coupled to the electromagnetic field generated by the microwave resonator for generating the plasma from the plasma gas. In this latter variant, the microwaves generated by the microwave generator are involved indirectly and directly in generating the plasma from the plasma gas.

In the case where the microwave resonator is part of the microwave driven plasma ion source, the shielding for shielding off the microwaves from passing from the inside of the microwave driven plasma ion source to the outside of the microwave driven plasma ion source is preferably for shielding off both the microwaves generated by the microwave generator and the electromagnetic field generated by the microwave resonator.

Preferably, the microwave resonator provides a clearance in which a major part of the electromagnetic field generated by the microwave resonator is located when the microwave driven plasma ion source is operated. Thereby, the major part of the electromagnetic field generated by the microwave resonator being located in the clearance of the microwave resonator preferably means that more than half of the total intensity of the electromagnetic field generated by the microwave resonator occurs inside the clearance in the microwave resonator. Advantageously, the plasma torch is arranged at least partially inside the clearance in the microwave resonator. Preferably, the first region in the inside of the plasma torch, where the process of the generation of the plasma from the plasma gas is located, is arranged inside the clearance in the microwave resonator. In a preferred variant, the second region in the inside of the plasma torch, where the process of ionising the sample to sample ions by exposing the sample to the plasma is located, is arranged inside the clearance in the microwave resonator, too. In an alternative variant however, the second region in the inside of the plasma torch, where the process of ionising the sample to sample ions by exposing the sample to the plasma is located, is arranged at least partially or completely outside of the clearance in the microwave resonator. In an alternative to these variants, the first region in the inside of the plasma torch, where the process of generation of the plasma from the plasma gas is located, is arranged at least partially outside or completely outside of the clearance in the microwave resonator.

Alternatively, the microwave resonator does not provide such a clearance in which a major part of the electromagnetic field generated by the microwave resonator is located when the microwave driven plasma ion source is operated.

In an alternative, the microwave driven plasma ion source goes without a microwave resonator for generating an electromagnetic field for inductively coupling the plasma gas to the electromagnetic field for the generation of the plasma from the plasma gas, wherein the microwave resonator exhibits a resonant behaviour and generates the electromagnetic field when being exposed to the microwaves generated by the microwave generator.

In a preferred variant, the microwave driven plasma ion source includes a plasma gas source, wherein the plasma torch comprises a plasma gas inlet for inserting the plasma gas from the plasma gas source through the plasma gas inlet into the inside of the plasma torch, wherein the plasma gas contains a nitrogen content from 80 volume percent to 100 volume percent. This has the advantage that the plasma gas cost-effective and readily available Advantageously, the plasma gas is nitrogen. Thereby, the nitrogen may comprise traces of other gases. Preferably however, in case of the plasma gas being nitrogen, at least 98 volume percent of the plasma gas is nitrogen, thus comprising 2 volume percent or less other gases.

In another preferred variant, the microwave driven plasma ion source includes a plasma gas source, wherein the plasma torch comprises a plasma gas inlet for inserting the plasma gas from the plasma gas source through the plasma gas inlet into the inside of the plasma torch, wherein the plasma gas contains an argon content from 0.9 volume percent to 100 volume percent, in particular from 95 volume percent to 100 volume percent. Thereby, the argon may comprise traces of other gases. Preferably however, in case the plasma gas is argon, at least 98 volume percent of the plasma gas is argon, thus comprising 2 volume percent or less other gases. Independent of the amount of any traces of other gases, argon as plasma gas has the advantage that the plasma gas does not chemically react with the sample during ionisation of the sample to sample ions.

Alternatively to nitrogen and argon, another gas or another mixture of gasses can be used as plasma gas. Furthermore the microwave driven plasma ion source may go with or without a plasma gas source. In case the microwave driven plasma ion source goes without plasma gas source, the microwave driven plasma ion source is advantageously connectable to a separate plasma gas source.

Advantageously, a mass spectrometer for mass analysing a sample includes the microwave driven plasma ion source according to the invention for ionising the sample to sample ions and a mass analyser for mass analysing the sample ions, the mass analyser having an ion inlet for inserting the sample ions from an outside of the mass analyser into an inside of the mass analyser for mass analysing the sample ions, the ion inlet having an aperture.

In the present text, "mass analysing the sample" preferably means determining a mass spectrum of the sample. In order to determine a mass spectrum of the sample, the sample is ionised to sample ions, whereafter the mass spectrum of the obtained sample ions is determined. Thus, the formulation "mass analysing the sample" means ionising the sample to sample ions and subsequently mass analysing the sample ions. Thereby, the formulations "mass spectrum of the sample" and "mass spectrum of the sample ions" refer to the same mass spectrum since the mass spectrum ultimately provides information on the distribution of the sample ions with respect to the sample ions' mass per charge ratio. In the case of obtaining a "mass spectrum of the sample" however, the sample is ionised to sample ions first, whereafter the mass spectrum is determined from the sample ions.

Advantageously, the mass analyser is fluidly coupled to the microwave driven plasma ion source for receiving the sample ions which exit the shielding outlet of the shielding of the microwave driven plasma ion source essentially in the plasma torch orientation direction and thereby for receiving the sample ions through the ion inlet for being mass analysed, wherein the ion inlet is arranged at least partially, particular advantageously entirely within a volume starting from the torch outlet and pointing in the plasma torch orientation direction, the volume having a cross section perpendicular to the plasma torch orientation direction corresponding to a projection of the torch aperture onto a plane oriented perpendicular to the plasma torch orientation direction. Thus, the cross section of the volume perpendicular to the plasma torch orientation direction as well as the position of the volume are defined by the torch outlet, while the extension of the volume away from the torch outlet is defined by the plasma torch orientation direction.

Independent of an orientation of the ion inlet with respect to the plasma torch orientation direction, the arrangement of the ion inlet at least partially or entirely within the volume starting from the torch outlet and pointing in the plasma torch orientation direction, the volume having a cross section perpendicular to the plasma torch orientation direction corresponding to a projection of the torch aperture onto a plane oriented perpendicular to the plasma torch orientation direction, has the advantage that more of the sample ions which exit the torch outlet and the shielding outlet are subsequently received by the mass analyser through the ion inlet for being mass analysed. Thus, the efficiency of the mass spectrometer is increased.

Advantageously, the mass analyser and the microwave driven plasma ion source are moveable relative to each other in a plane having a normal being maximally inclined by an angle of 20° with respect to the plasma torch orientation direction. Thus, the normal of the plane can be parallel to the plasma torch orientation direction or can be tilted relatively to the plasma torch orientation direction with an angle of 20° or less. Therefore, a position of the ion inlet of the mass analyser relative to the shielding outlet of the shielding of the microwave driven plasma ion source can be changed. This has the advantage that a number of ions of the sample ions which exit the torch outlet and the shielding outlet and subsequently pass through the ion inlet for being mass analysed can easily be maximised by moving the mass analyser relatively to the microwave driven plasma ion source. This maximisation enables to increase the efficiency of the mass spectrometer even at different operation parameters of the microwave driven plasma ion source since in the inside of the plasma torch, a position and a shape of the second region where the sample ions are generated by exposing the sample to the plasma as well as a position within the second region where a density of the generated sample ions is the highest varies depending on the operation parameters of microwave driven plasma ion source. Thus, the mass spectrometer enables to optimise not only the efficiency of the generation of the sample ions from the sample but also enables to optimize the efficiency of the transfer of the ions from the microwave driven plasma ion source into the mass analyser for mass analysing the sample ions.

Preferably, the movement of the mass analyser relative to the microwave driven plasma ion source is actuated by at least one actuator, in particular at least one motor. Thus, the mass spectrometer preferably comprises at least one actuator, in particular at least one motor, for actuating the movement of the mass analyser relative to the microwave driven plasma ion source. Alternatively, however, the mass spectrometer may go without such an actuator. In this case, the mass analyser may be moveable by hand relative to the microwave driven plasma ion source.

In a first preferred variant, the mass analyser and the microwave driven plasma ion source are moveable relative to each other only in the mentioned plane having the normal being maximally inclined by an angle of 20° with respect to the plasma torch orientation direction. In a second preferred variant however, the mass analyser and the microwave driven plasma ion source are moveable relative to each other in other directions than in the mentioned plane having the normal being maximally inclined by an angle of 20° with respect to the plasma torch orientation direction, too.

Preferably, the mass analyser and the microwave driven plasma ion source are moveable relative to each other along two axes being oriented perpendicular to each other.

In case the mass analyser and the microwave driven plasma ion source are at the same time moveable relative to each other in the plane having the normal being maximally inclined by an angle of 20° with respect to the plasma torch orientation direction, the two axes are preferably arranged within this plane. This has the advantage that the mass analyser and the microwave driven plasma ion source can easily be moved in a controlled manner relative to each other in the plane having the normal being maximally inclined by an angle of 20° with respect to said plasma torch orientation direction. Thus, a well controlled optimisation of the efficiency of the mass spectrometer is enabled.

In a variant however, only one of the two axes or none of the two axes is arranged in this plane.

Preferably, the mass analyser and the microwave driven plasma ion source are moveable relative to each other along three axes being oriented perpendicular to each other. This has the advantage that the mass analyser and the microwave driven plasma ion source can easily be moved in a controlled manner in all directions relative to each other in order to maximise the efficiency of the mass spectrometer.

In a preferred variant however, the mass analyser and the microwave driven plasma ion source are moveable relative to each other only along two axes being oriented perpendicular to each other. Advantageously, these two axes are arranged within in the plane having the normal being maximally inclined by an angle of 20° with respect to the plasma torch orientation direction.

In yet another variant, the mass analyser and the microwave driven plasma ion source are moveable relative to each other only along one axis.

Independent of whether the mass analyser and the microwave driven plasma ion source are moveable relative to each other in a plane having a normal being maximally inclined by an angle of 20° with respect to said plasma torch orientation direction or not, the mass analyser and the microwave driven plasma ion source are advantageously pivotable relative to each other about one pivot axis which is oriented essentially perpendicular to the plasma torch orientation direction. Thus, the one pivot axis is advantageously tilted with respect to the plasma torch orientation at an angle in a range between 45° and 135°, particular advantageously between 70° and 110°. Most advantageously, the one pivot axis is however tilted with respect to the plasma torch orientation at an angle of 90°. The mass analyser and the microwave driven plasma ion source being pivotable relative to each other about this one pivot axis has the advantage that an orientation of the mass analyser relative to the microwave driven plasma ion source can be optimised in the plane being oriented perpendicular to the pivot axis in order to maximise the number of ions of the sample ions which exit the torch outlet and the shielding outlet and subsequently pass through the ion inlet for being mass analysed. Thus, the mass spectrometer enables to optimise the efficiency of the transfer of the ions from the microwave driven plasma ion source into the mass analyser for mass analysing the sample ions further.

In a preferred variant, the mass analyser and the microwave driven plasma ion source are pivotable relative to each other about two pivot axes which are oriented essentially perpendicular to the plasma torch orientation direction. Thus, the pivot axes are advantageously tilted with respect to the plasma torch orientation at an angle in a range between 45° and 135°, particular advantageously between 70° and 110°. Most advantageously, the pivot axes are however tilted with respect to the plasma torch orientation at an angle of 90°. Independent of the precise angle, this has the advantage that an orientation of the mass analyser relative to the microwave driven plasma ion source can be optimised in the planes being oriented perpendicular to the pivot axes in order to maximise the number of ions of the sample ions which exit the torch outlet and the shielding outlet and subsequently pass through the ion inlet for being mass analysed. Thus, the mass spectrometer enables to optimise the efficiency of the transfer of the sample ions from the microwave driven plasma ion source into the mass analyser for mass analysing the sample ions further.

Particular advantageous, these two pivot axes are oriented perpendicular to each other. This has the advantage that a systematic optimisation of the efficiency of the transfer from the ions from the microwave driven plasma ion source into the mass analyser for mass analysing the sample ions is enabled.

Alternatively to these variants with one or two pivot axes, the mass analyser and the microwave driven plasma ion source can be not pivotable about any axis relative to each other or they can be pivotable relative to each other about more than two pivot axes.

Other advantageous embodiments and combinations of features come out from the detailed description below and the entirety of the claims.

BRIEF DESCRIPTION OF THE DRAWINGS

The drawings used to explain the embodiments show.

In the figures, the same components are given the same reference symbols.

PREFERRED EMBODIMENTS

Figure 1:
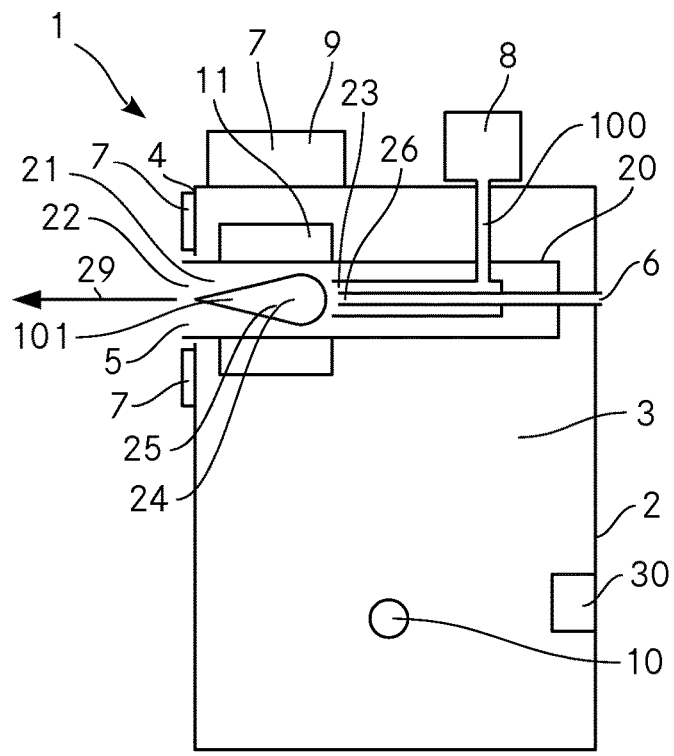
FIG. 1 a simplified schematic view of a microwave driven plasma ion source according to the invention for ionising a sample to be ionised to sample ions, FIG. 2 a simplified schematic view of another microwave driven plasma ion source according to the invention for ionising a sample to be ionised to sample ions, FIG. 3 a simplified schematic view of a mass spectrometer for mass analysing a sample including a microwave driven plasma ion source according to the invention for ionising the sample to sample ions and a mass analyser for mass analysing the sample ions, FIG. 4 a simplified schematic view of a mass spectrometer for mass analysing a sample similar to the mass spectrometer shown in FIG. 3, and FIG. 5 a simplified schematic view of yet another similar mass spectrometer for mass analysing a sample.

FIG. 1 shows a simplified schematic view of a microwave driven plasma ion source 1 according to the invention for ionising a sample to be ionised to sample ions. Thereby, the sample is an aerosol comprising aerosol particles dispersed in a gas. Some of these aerosol particles are solid particles, while other ones of the aerosol particles are liquid particles. In a variant however, all aerosol particles are solid particles. In another variant, the aerosol particles are liquid particles. In yet another variant, the sample is a gas. Independent of the type of sample, the microwave driven plasma ion source 1 includes a sample intake 6 for inserting the sample to be ionised from an outside of the microwave driven plasma ion source 1 into an inside 3 of the microwave driven plasma ion source 1.

The microwave driven plasma ion source 1 shown in FIG. 1 includes a microwave generator 10 for generating microwaves and a microwave resonator 11, both arranged in an inside 3 of the microwave driven plasma ion source 1. The microwave generator 10 is an antenna connected to an AC voltage source 30 of the microwave driven plasma ion source 1. This AC voltage source 30 generates an AC voltage alternating at a frequency in a range from 1 MHz to 10 GHz and supplies this AC voltage to the microwave generator 10. In a variant, the frequency is in a range from 30 MHz to 3 GHz. In yet another variant, the frequency is in a range from 30 MHz to 300 MHz. In yet another variant, the frequency is in a range from 300 MHz to 3 GHz. In one particular example, the frequency is 250 MHz. In another particular example, the frequency is 350 MHz.

The microwave resonator 11 has an annular shape and exhibits a resonant behaviour and generates an electromagnetic field for generation of a plasma 101 from a plasma gas 100 when being exposed to the microwaves generated by the microwave generator 10. Thus, the microwave generator 10 is for generating microwaves for generating the plasma 101 from the plasma gas 100 indirectly by generating microwaves which excite the microwave resonator 11 to generate the electromagnetic field which inductively couples the plasma gas 100 to the electromagnetic field for generating the plasma 101 from the plasma gas 100.

The microwave driven plasma ion source 1 further includes a plasma torch 20 which extends through an opening in the annular shape of the microwave resonator 11. This plasma torch 20 comprises a sample inlet 26 fluidly coupled to the sample intake 6 of the microwave driven plasma ion source 1 for inserting the sample from the sample intake 6 into an inside 21 of the plasma torch 20. Furthermore, the plasma torch 20 comprises a plasma gas inlet 23 for inserting the plasma gas 100 from a plasma gas source 8 of the microwave driven plasma ion source 1 through the plasma gas inlet 23 into the inside 21 of the plasma torch 20. Thereby, the plasma gas 100 contains a nitrogen content from 80 volume percent to 100 volume percent. In a variant, the plasma gas 100 is nitrogen. In another variant however, the plasma gas 100 is argon. In a further variant, the plasma gas source 8 is not part of the microwave driven plasma ion source 1. In this case, the microwave driven plasma ion source comprises a plasma gas source connector fluidly coupled to the plasma gas inlet 23, the plasma gas source connector being fluidly connectable to a separate plasma gas source for supplying the plasma gas from the separate plasma gas source via the plasma gas source connector and the plasma gas inlet 23 into the inside 21 of the plasma torch 20.

The inside 21 of the plasma torch 20 is for housing a process of generation of the plasma 101 from the plasma gas 100 and for housing a process of ionising the sample to the sample ions by exposing the sample to the plasma 101. Thereby, the process of generation of the plasma 101 from the plasma gas 100 is run in a first region 24 in the inside 21 of the plasma torch 20 in an area in the opening of the annular shape of the microwave resonator 11. In operation of the microwave driven plasma ion source 1, microwaves generated with the microwave generator 10 excite the microwave resonator to generate an electromagnetic field in the first region 24. The plasma gas 100 is inductively coupled to the electromagnetic field in the first region 24 for generation of the plasma 101 from the plasma gas 100. By exposing the sample to the plasma 101 in a second region 25 in the inside of the plasma torch 20, the process of ionising the sample to the sample ions is run in this second region 25 in the inside of the plasma torch 20. Thereby, the first region 24 and the second region 25 are overlapping. In another variant, the first region 24 and the second region 25 are identical.

The plasma torch 20 further comprises a torch outlet 22 for letting out the plasma 101 and the sample ions from the inside 21 of the plasma torch 20 to an outside of the plasma torch 20, wherein the torch outlet 22 has a torch aperture. This torch aperture is measured in units of area and is 70 mm$^2$. In a variant, the torch aperture is 100 mm$^2$. In another variant, the torch aperture is 111 mm$^2$. In yet another variant, the torch aperture is 300 mm$^2$. In yet another variant, the torch aperture is 500 mm$^2$. In yet another variant, the torch aperture is 600 mm$^2$. In yet another variant, the torch aperture is 900 mm$^2$.

The plasma torch 20 has an elongated shape. This shape can be considered as the shape of a tube. In this picture, an open end of the tube forms the torch outlet 22. Inside this tube, the plasma gas inlet 23 is arranged concentrically with the tube such that the plasma gas 100 is inserted by the plasma gas inlet 23 into the inside 21 of the plasma torch 20 to flow along a longitudinal axis of the tube. In the inside of the plasma torch 20, the plasma gas 100 is inductively coupled to the electromagnetic field in the first region 24 to generate the plasma 101. The plasma 101 then exits the plasma torch 20 through the torch outlet 22 which is formed by the open end of the tube.

Similar to the plasma gas inlet 23, the sample inlet 26 is arranged in the inside 21 of the plasma torch 20 concentrically with the tube forming the plasma torch 20 such that the sample is inserted by the sample inlet 26 into the inside 21 of the plasma torch 20 to flow along the longitudinal axis of the tube. More precisely, the sample inlet 26 is arranged concentrically in the plasma gas inlet 23 such that the sample is inserted into the inside 21 of the plasma torch 20 to flow through the plasma 101 generated from the plasma gas 100 for being ionised to the sample ions. Since the plasma gas 100, the plasma 101 and the sample are inserted into the inside 21 of the plasma torch 20 to flow along the longitudinal axis of the tube forming the plasma torch 20, both the plasma 101 and the sample ions exit the plasma torch 20 through the torch outlet 22 which is the open end of the tube forming the plasma torch 20. Thus, the flow direction of the plasma gas 100, the plasma 101 and the sample ions is a plasma torch orientation direction 29 indicated by an arrow in FIG. 1. This plasma torch orientation direction 29 runs parallel to the longitudinal axis of the tube forming the plasma torch 20 and points from the inside 21 of the plasma torch 20 through the torch outlet 22 out of the plasma torch 20. Since the plasma 101 and the sample ions exit the plasma torch 20 in the plasma torch orientation direction 29 in a beam having some divergence, the formulation that the plasma 101 an the sample ions are let out of the torch outlet 22 essentially in the plasma torch orientation direction 29 is applicable.

The microwave driven plasma ion source 1 additionally includes a housing 2 surrounding the inside 3 of the microwave driven plasma ion source 1. This housing 2 is made from tungsten and forms a shielding 4 for shielding off the microwaves from passing from the inside 3 of the microwave driven plasma ion source 1 to an outside of the microwave driven plasma ion source 1. Thereby, the inside 3 of the microwave driven plasma ion source 1 has an outer limit being a closed surface which is defined by the shielding 4. However, the shielding 4 comprises a shielding outlet 5 for letting out the plasma 101 and the ions from the inside 3 of the microwave driven plasma ion source 1 to the outside of the microwave driven plasma ion source 1, wherein the shielding outlet 5 has a shielding aperture.

The shielding outlet 5 is fluidly coupled to the torch outlet 22 for letting out the plasma 101 and the sample ions from the inside 21 of the plasma torch 20 essentially in the plasma torch orientation direction 29 to the outside of the microwave driven plasma ion source 1. Thereby, a size of the shielding aperture is 149% of a size of the torch aperture, wherein both the size of the shielding aperture and the size of the torch aperture are measured in units of area. In a variant, the size of the shielding aperture is 124% of the size of the torch aperture. In yet another variant, the size of the shielding aperture is 109% of the torch aperture.

Thus, the shielding aperture is somewhat larger than the torch aperture. In the embodiment shown in FIG. 1, the shielding aperture is even larger than an outer diameter of the plasma torch 20. Thereby, a largest part of the plasma torch 20 is arranged in the inside 3 of the microwave driven plasma ion source 1. Only a region of the torch outlet 22 of the plasma torch 20 reaches from the inside 3 of the microwave driven plasma ion source 1 through the shielding outlet 5 to the outside of the microwave driven plasma ion source 1. Thereby, the torch outlet 22 of the plasma torch 20 protrudes from the shielding outlet 5 by 3 mm.

Despite the shielding outlet 5 in the shielding 4 of the microwave driven plasma ion source 1, the shielding 4 covers 98.5% of the closed surface defining the outer limit of the inside 3 of the microwave driven plasma ion source 1.

The microwave driven plasma ion source 1 further comprises a cooling liquid circuit 7 being a closed loop circuit for containing a cooling liquid for cooling the shielding 4. This cooling liquid circuit 7 comprises a reservoir 9 of cooling liquid and passes amongst others around the shielding outlet 5 for cooling the shielding 4 in an area of the shielding outlet 5. Thus, the shielding 4 can be cooled efficiently in the area of the shielding outlet 5 where ions of the plasma 101 are most likely to hit the shielding and heat up the shielding 4.

In the embodiment shown in FIG. 1, the cooling liquid is water. In a variant however, another cooling liquid than water is used. In one example, the cooling liquid is liquid nitrogen. Thus, in either case, the shielding 4, in particular the area of the shielding 4 where the shielding outlet 5 is located, is coolable by the respective cooling liquid.

Figure 2:
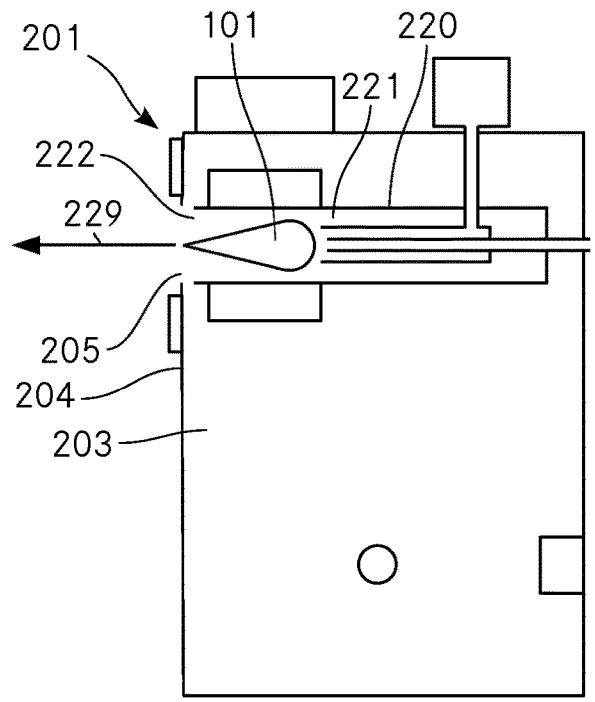

FIG. 2 shows a simplified schematic view of another microwave driven plasma ion source 201 according to the invention for ionising a sample to be ionised to sample ions. This microwave driven plasma ion source 201 is in most parts the same as the microwave driven plasma ion source 1 shown in FIG. 1. In contrast to the microwave driven plasma ion source 1 shown in FIG. 1 however, the microwave driven plasma ion source 201 shown in FIG. 2 comprises a plasma torch 202 which is arranged in the inside 203 of the microwave driven plasma ion source 201. Nonetheless, the shielding outlet 205 is as well fluidly coupled to the torch outlet 222 for letting out the plasma 101 and the sample ions from the inside 221 of the plasma torch 220 essentially in the plasma torch orientation direction 229 to the outside of the microwave driven plasma ion source 201. Thereby, there is a gap of 4.5 mm between the torch outlet 222 and the shielding outlet 205. In a variant, this gap is only 2 mm. In either case, the shielding outlet 205 is arranged in the vicinity of the torch outlet 222.

In the embodiment shown in FIG. 2, the size of the shielding aperture is 105% of the size of the torch aperture and the shielding 204 covers 99.1% of the closed surface defined by the shielding 204. In a variant, the size of the shielding aperture is 100% of the size of the torch aperture while the shielding 204 covers 99.5% of the closed surface defined by the shielding 204. In another variant, the torch outlet 222 and the shielding outlet 205 are flush and without gap in between. In this latter variant, the size of the shielding aperture is 100% of the size of the torch aperture, too.

Figure 3:
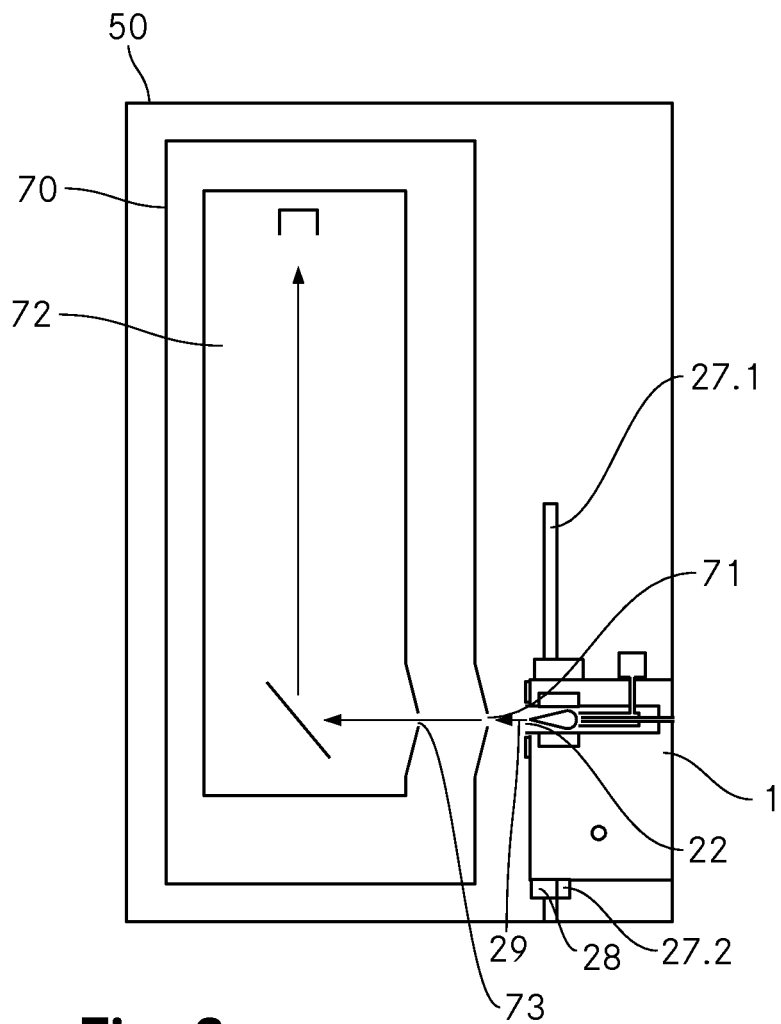

FIG. 3 shows a simplified schematic view of a mass spectrometer 50 for mass analysing a sample. This mass spectrometer 50 includes a microwave driven plasma ion source according to the invention for ionising the sample to sample ions. In FIG. 3, the microwave driven plasma ion source 1 of FIG. 1 is exemplary shown. Instead, the microwave driven plasma ion source included in the mass spectrometer 50 can also be the microwave driven plasma ion source 201 of FIG. 2 or any other microwave driven plasma ion source according to the invention.

Besides a microwave driven plasma ion source according to the invention, the mass spectrometer 50 includes a mass analyser 70 for mass analysing the sample ions. This mass analyser 70 has an ion inlet 71 for inserting the sample ions from an outside of the mass analyser 70 into an inside 72 of the mass analyser 70 for mass analysing the sample ions. Thereby, a second opening 73 is arranged further inside the mass analyser 70 as compared to the ion inlet 71 such that sample ions having a trajectory with an orientation within a certain range of orientations can pass the ion inlet 71 of the mass analyser 70 first and the second opening 73 second in order to reach into the inside 72 of the mass analyser 70 for being mass analysed.

The mass analyser 70 is fluidly coupled to the microwave driven plasma ion source 1 for receiving through the ion inlet 71 the sample ions which exit the shielding outlet 5 of the shielding 4 of the microwave driven plasma ion source 1 essentially in the plasma torch orientation direction 29. Thereby, the ion inlet 71 is arranged entirely within a volume starting from the torch outlet 22 and pointing in the plasma torch orientation direction 29, the volume having a cross section perpendicular to the plasma torch orientation direction 29 corresponding to a projection of the torch aperture onto a plane oriented perpendicular to the plasma torch orientation direction 29. Thus, the cross section of the volume perpendicular to the plasma torch orientation direction 29 as well as the position of the volume are defined by the torch outlet 22, while the extension of the volume away from the torch outlet 22 is defined by the plasma torch orientation direction 29.

In the inside 21 of the plasma torch 20, a position and a shape of the second region 25 where the sample ions are generated by exposing the sample to the plasma 101 depends on the operation parameters of the microwave driven plasma ion source 1. Furthermore, a position within the second region 25 where a density of the generated sample ions is the highest depends on the operation parameters of microwave driven plasma ion source 1, too. Thus, the position in the inside 21 of the plasma torch 20, where the most sample ions are generated, changes when the operation parameters of the microwave driven plasma ion source 1 are changed. Consequently, the position in the aperture of the torch outlet 22 where a majority of sample ions emerges from the inside 21 of the plasma torch 20 through the torch outlet 22 essentially in the plasma torch orientation direction 29 changes depending on the operation parameters of the microwave driven plasma ion source 1.

The operation parameters of the microwave driven plasma ion source 1 can be optimised in order to generate a maximum total number of sample ions. Thereby, the optimal operation parameters depend on the type of sample to be ionised to sample ions. In order to optimise additionally the fraction of the total number of the generated sample ions which emerges from the inside of the 21 plasma torch 20 and makes its way through the aperture of the ion inlet 71 into the inside 72 of the mass analyser 70 for being mass analysed, the mass analyser 70 and the microwave driven plasma ion source 1 are moveable relative to each other in a plane having a normal being the plasma torch orientation direction 29. In the embodiment of the mass spectrometer 50 shown in FIG. 3, the mass spectrometer 50 comprises a motor 28 for actuating a movement of the microwave driven plasma ion source 1 along two linear tracks 27.1, 27.2 within the mass spectrometer 50. These linear tracks 27.1, 27.2 are oriented perpendicular to each other and perpendicular to the plasma torch orientation direction 29. Thus, the linear tracks 27.1, 27.2 are arranged parallel to the plane having the normal being the plasma torch orientation direction 29. This allows for changing a position of the ion inlet 71 of the mass analyser 70 relative to the shielding outlet 5 of the shielding 4 of the microwave driven plasma ion source 1. Therefore, a number of ions of the sample ions which exit the shielding outlet 5 and subsequently pass through the ion inlet 71 for being mass analysed can easily be maximised by moving the mass analyser 70 relatively to the microwave driven plasma ion source 1 to a correct position. This maximisation enables to increase and thus to optimise the efficiency of the mass spectrometer 50 at different operation parameters of the microwave driven plasma ion source 1.

In a variant, the two linear tracks are not oriented perpendicular but at another angle to each other such that the microwave driven plasma ion source 1 can be moved in two different directions being oriented perpendicular to each other in the plane having the normal being the plasma torch orientation direction 29.

In yet another variant, the microwave driven plasma ion source 1 is movable along a first linear track within the mass spectrometer 50, while the mass analyser 70 is moveable along a second linear track, wherein the first track and the second track are arranged at an angle to each other and parallel to the plane having the normal being the plasma torch orientation direction 29 such that the microwave driven plasma ion source 1 and the mass analyser 70 can be moved in two different directions being oriented perpendicular to each other in the plane having the normal being the plasma torch orientation direction 29.

In yet another variant where the same optimisation can be achieved, the mass analyser 70 is moveable along two linear tracks within the mass spectrometer 50, the linear tracks being oriented perpendicular or at another angle to each other and being arranged in a plane having a normal being the plasma torch orientation direction 29. Thereby, it is possible that only the mass analyser 70 is moveable within the mass spectrometer 50 or that both the mass analyser 70 and the microwave driven plasma ion source 1 are moveable within the mass spectrometer 50.

In variation of the before mentioned variants, the plane parallel to which the linear tracks are arranged has a normal being inclined at an angle of 44° to the plasma torch orientation direction 29. In another variation, the plane parallel to which the linear tracks are arranged has a normal being inclined at an angle of 19° to the plasma torch orientation direction 29.

These variants and variations have in common that the mass analyser 70 and the microwave driven plasma ion source 70 are moveable relative to each other along two axes being oriented perpendicular to each other.

In either one of these variants, the mass spectrometer 50 may comprise one motor for actuating the movement of the microwave driven plasma ion source 1 or the mass analyser 70, respectively, along one track, and another motor for actuating the movement of the microwave driven plasma ion source 1 or the mass analyser 70, respectively, along the other track. If both the microwave driven plasma ion source 1 and the mass analyser 70 are moveable along two tracks each, then the mass spectrometer 50 may of course comprise four motors for actuating these movements.

In either of these variants, mass analyser 70 and the microwave driven plasma ion source 1 are additionally pivotable relative to each other about two pivot axes which are oriented perpendicular to the plasma torch orientation direction 29. These two axes are structurally incorporated in the two linear tracks 27.1, 27.2. Thus, the two linear tracks 27.1, 27.2 and their actuation enable a movement of the mass analyser 70 and the microwave driven plasma ion source 1 relatively to each other along the respective linear track 27.1, 27.2 and a pivoting of the mass analyser 70 and the microwave driven plasma ion source 1 relatively to each other about the respective linear track 27.1, 27.2 and thus about the respective axis. Therefore, an orientation of the mass analyser 70 relative to the microwave driven plasma ion source 1 can be optimised in the planes being oriented perpendicular to the pivot axes in order to maximise the number of ions of the sample ions which exit the torch outlet 22 and the shielding outlet 5 essentially in the plasma torch orientation direction 29 and subsequently pass through the ion inlet 71 for being mass analysed. Thus, the mass spectrometer 50 enables to optimise the efficiency of the transfer of the sample ions from the microwave driven plasma ion source 1 into the mass analyser 70 for mass analysing the sample ions further.

Figure 4:
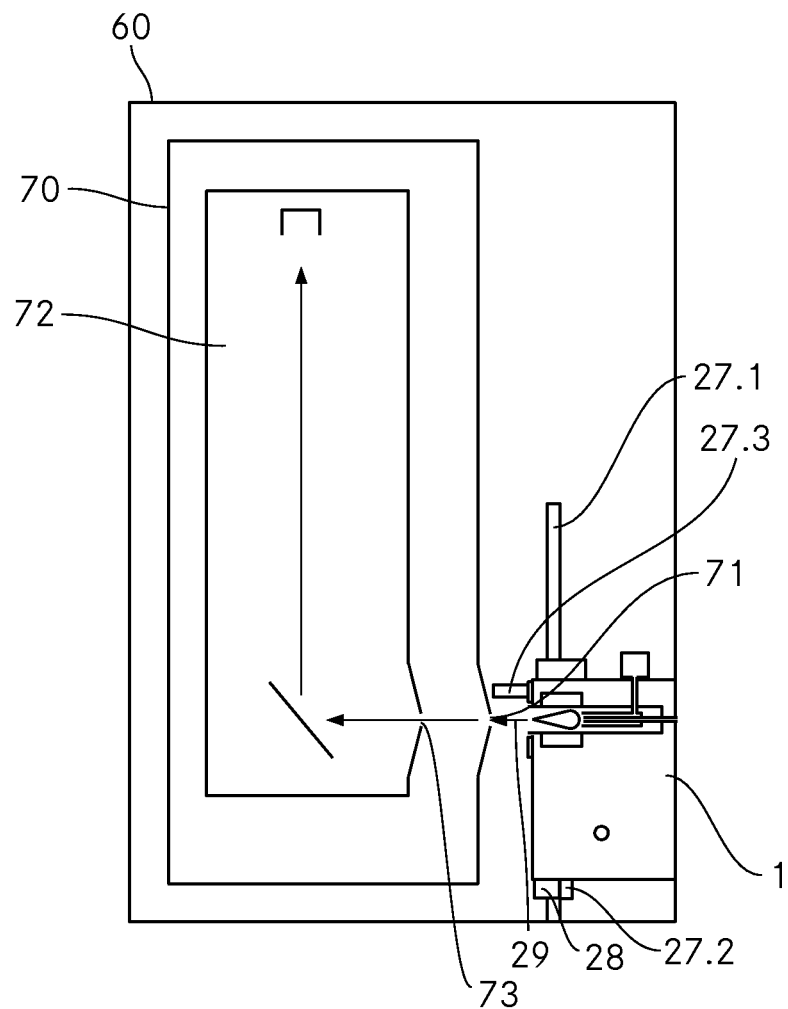

FIG. 4 shows a simplified schematic view of a similar mass spectrometer 60 for mass analysing a sample similar to the mass spectrometer 50 shown in FIG. 3. This mass spectrometer 60 shown in FIG. 4 as well includes a microwave driven plasma ion source according to the invention for ionising the sample to sample ions. In contrast to the mass spectrometer 50 shown in FIG. 3, the mass spectrometer 60 shown in FIG. 5 however provides a third linear track 27.3 along which the microwave driven plasma ion source 1 is moveable. Thus, the microwave driven plasma ion source 1 is moveable along three linear tracks 27.1, 27.2, 27.3 within the mass spectrometer 50. These linear tracks 27.1, 27.2, 27.3 are oriented perpendicular to each other. Two of these linear tracks 27.1, 27.2 are oriented perpendicular to the plasma torch orientation direction 29, while the third one of these linear tracks 27.3 is oriented parallel to the plasma torch orientation direction 29. Thus, the mass analyser 70 and the microwave driven plasma ion source 1 can easily be moved in a controlled manner in all directions relative to each other in order to maximise the efficiency of the mass spectrometer 60.

Figure 5:
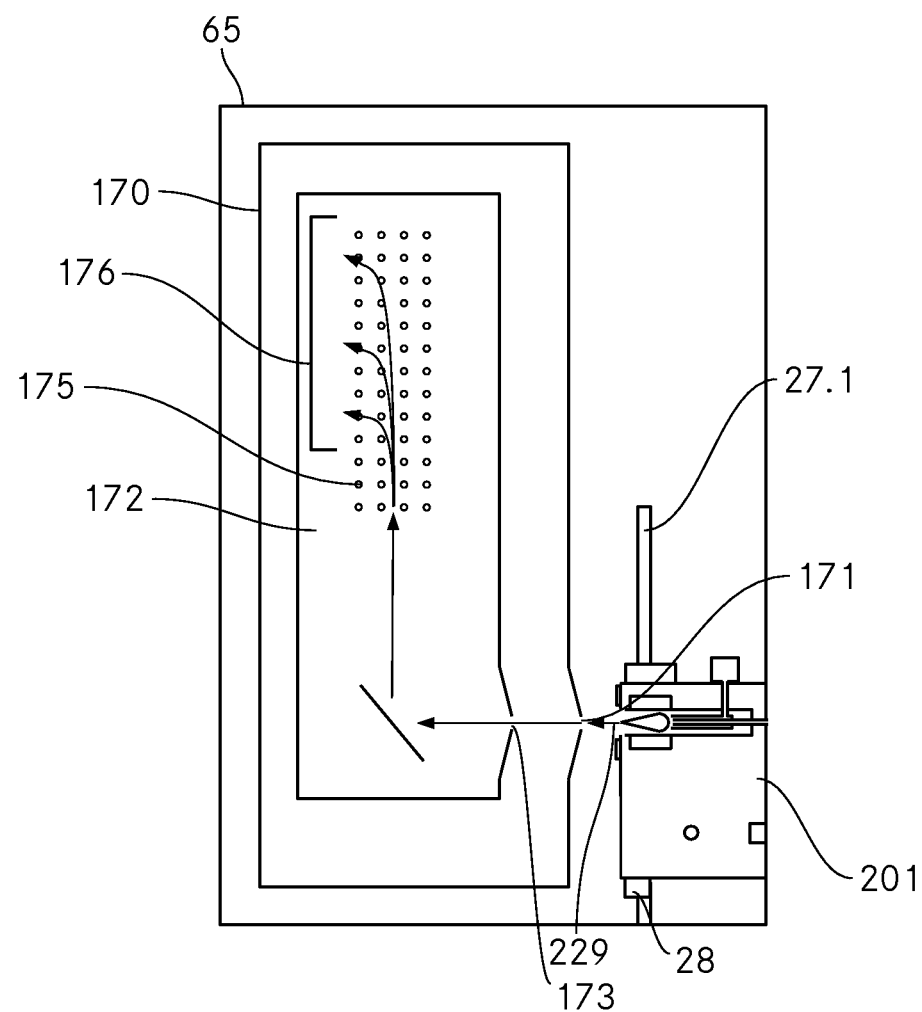

FIG. 5 shows a simplified schematic view of yet another similar mass spectrometer 65 for mass analysing a sample. In this embodiment, the mass spectrometer 65 comprises the microwave driven plasma ion source 201 shown in FIG. 2. In variants, the mass spectrometer 65 comprises any other microwave driven plasma ion source according to the invention like for example the one shown in FIG. 1.

The mass spectrometer 65 shown in FIG. 5 further comprises a mass analyser 170 being a sector mass analyser which uses magnetic field 175 for mass separating the sample ions spatially such that the sample ions reach a position sensitive detector 176 of the mass analyser 170 at positions which depend on the mass to charge ratio of the respective sample ion and thus indicate the mass to charge ratio of the respective sample ion. Thus, a resolution of the mass analyser 170 depends on a divergence of a beam of the sample ions reaching into the inside 172 of the mass analyser 172 for being mass analysed. In particular, the resolution of the mass analyser 170 depends on a divergence of the beam of the sample ions in an ion separation direction in which the sample ions are spatially separated by the magnetic field 175.

The mass analyser 170 comprises an ion inlet 171 and a second opening 173. The mass analyser 170 and the microwave driven plasma ion source 201 are moveable relative to each other along one axis being oriented perpendicular to the plasma torch orientation direction 229. Thereby, the axis being is the linear track 27.1 along which the microwave driven plasma ion source 201 is moveable for moving the mass analyser 170 relatively to the microwave driven plasma ion source 201. By moving the mass analyser 170 relatively to the microwave driven plasma ion source 201, a number of sample ions exiting from the torch outlet and reaching into the inside of the mass analyser 170 for being mass analysed can be maximised.

The invention is not limited to the embodiments and variants described above. Other variants are readily available to the person skilled in the art.

In summary, it is to be noted that a microwave driven plasma ion source pertaining to the technical field initially mentioned is created, that enables a simple and stable optimisation of its operation parameters for maximised sample ion generation.

The invention claimed is:

1. A microwave driven ion source for ionising a sample to be ionised to sample ions, the microwave driven plasma ion source including:
   a) a sample intake for inserting said sample from an outside of said microwave driven plasma ion source into an inside of said microwave driven plasma ion source;
   b) a microwave generator for generating microwaves for generating a plasma from a plasma gas, wherein the microwaves are the electromagnetic waves of radio frequency electromagnetic radiation in the microwave range, wherein the microwave range is the range of electromagnetic radiation having a frequency from 300 MHz to 3 GHz;
   c) a plasma torch providing a plasma torch orientation direction and having an inside for housing a process of generation of said plasma from said plasma gas and for housing a process of ionising said sample to said sample ions by exposing said sample to said plasma, wherein said plasma torch comprises a torch outlet for letting out said plasma and said sample ions from said inside of said plasma torch essentially in said plasma torch orientation direction to an outside of said plasma torch, said torch outlet having a torch aperture;
wherein said microwave driven plasma ion source includes a shielding for shielding off said microwaves from passing from said inside of said microwave driven plasma ion source to said outside of said microwave driven plasma ion source, wherein said shielding comprises a shielding outlet for letting out said plasma and said sample ions from said inside of said microwave driven plasma ion source essentially in said plasma torch orientation direction to said outside of said microwave driven plasma ion source, said shielding outlet having a shielding aperture,
wherein said shielding outlet is fluidly coupled to said torch outlet for letting out said plasma and said sample ions from said inside of said plasma torch essentially in said plasma torch orientation direction to said outside of said microwave driven plasma ion source, wherein a size of said shielding aperture is less than 150% of a size of said torch aperture, wherein both said size of said shielding aperture and said size of said torch aperture are measured in units of area.

2. The microwave driven plasma ion source according to claim 1, wherein said plasma torch is arranged in said inside of said microwave driven plasma ion source.

3. The microwave driven plasma ion source according to claim 1, wherein a size of said torch aperture measured in units of area is in a range from 70 mm$^2$ to 900 mm$^2$.

4. The microwave driven plasma ion source according to claim 1, wherein said inside of said microwave driven plasma ion source has an outer limit being a closed surface, wherein said shielding defines said closed surface and covers at least at least 98% of said closed surface.

5. The microwave driven plasma ion source according to claim 1, wherein said shielding is made from metal.

6. The microwave driven plasma ion source according to claim 1, wherein said microwave driven plasma ion source comprises a cooling liquid circuit for containing a cooling liquid for cooling said shielding wherein said shielding is coolable by said cooling liquid.

7. The microwave driven plasma ion source according to claim 1, wherein said microwave driven plasma ion source includes a microwave resonator for generating an electromagnetic field for inductively coupling the plasma gas to the electromagnetic field for generation of said plasma from said plasma gas, wherein said microwave resonator exhibits a resonant behaviour and generates said electromagnetic field when being exposed to said microwaves generated by said microwave generator.

8. The microwave driven plasma ion source according to claim 1, wherein said microwave driven plasma ion source includes a plasma gas source, wherein said plasma torch comprises a plasma gas inlet for inserting said plasma gas from said plasma gas source through said plasma gas inlet into said inside of said plasma torch, wherein said plasma gas contains a nitrogen content from 80 volume percent to 100 volume percent.

9. The microwave driven plasma ion source according to claim 1, wherein said microwave driven plasma ion source includes a plasma gas source, wherein said plasma torch comprises a plasma gas inlet for inserting said plasma gas from said plasma gas source through said plasma gas inlet into said inside of said plasma torch, wherein said plasma gas contains an argon content from 0.9 volume percent to 100 volume percent.

10. The microwave driven plasma ion source according to claim 9, wherein said plasma gas contains an argon content from 0.95 volume percent to 100 volume percent.

11. A mass spectrometer for mass analysing a sample, said mass spectrometer including:
   a microwave driven plasma ion source according to claim 1 for ionising said sample to sample ions and
   a mass analyser for mass analysing said sample ions, said mass analyser having an ion inlet for inserting said sample ions from an outside of said mass analyser into an inside of said mass analyser for mass analysing said sample ions, said ion inlet having an aperture.

12. The mass spectrometer according to claim 11, wherein said mass analyser is fluidly coupled to said microwave driven plasma ion source for receiving said sample ions which exit said shielding outlet of said shielding (4) of said microwave driven plasma ion source essentially in said plasma torch orientation direction and thereby for receiving said sample ions through said ion inlet for being mass analysed, wherein said ion inlet is arranged at least partially within a volume starting from said torch outlet and pointing in said plasma torch orientation direction, said volume having a cross section perpendicular to said plasma torch orientation direction corresponding to a projection of said torch aperture onto a plane oriented perpendicular to said plasma torch orientation direction.

13. The mass spectrometer according to claim 12, wherein said ion inlet is arranged entirely within said volume starting from said torch outlet and pointing in said plasma torch orientation direction, said volume having a cross section perpendicular to said plasma torch orientation direction corresponding to a projection of said torch aperture onto a plane oriented perpendicular to said plasma torch orientation direction.

14. The mass spectrometer according to claim 11, wherein said mass analyser and said microwave driven plasma ion source are moveable relative to each other in a plane having a normal being maximally inclined by an angle of 20° with respect to said plasma torch orientation direction.

15. The mass spectrometer according to claim 14, wherein said mass analyser and said microwave driven plasma ion source are moveable relative to each other along three axes being oriented perpendicular to each other.

16. The mass spectrometer according to claim 11, wherein said mass analyser and said microwave driven plasma ion source are moveable relative to each other along two axes being oriented perpendicular to each other.

17. The mass spectrometer according to claim 11, wherein said mass analyser and said microwave driven plasma ion source are pivotable relative to each other about one pivot axis which is oriented essentially perpendicular to said plasma torch orientation direction.

18. The mass spectrometer according to claim 11, wherein said mass analyser and said microwave driven plasma ion source are pivotable relative to each other about two pivot axes which are oriented essentially perpendicular to said plasma torch orientation direction.

19. The microwave driven plasma ion source according to claim 1, wherein said size of said shielding aperture is less than 125% of said size of said torch aperture.

20. The microwave driven plasma ion source according to claim 1, wherein said size of said shielding aperture is less than 110% of said size of said torch aperture.

* * * * *